(12) United States Patent
Kopp

(10) Patent No.: US 10,650,336 B2
(45) Date of Patent: May 12, 2020

(54) METHOD AND SYSTEM FOR ADAPTIVELY SWITCHING PREDICTION STRATEGIES OPTIMIZING TIME-VARIANT ENERGY CONSUMPTION OF BUILT ENVIRONMENT

(71) Applicant: Conectric, LLC, Lewes, DE (US)

(72) Inventor: Phillip Kopp, San Diego, CA (US)

(73) Assignee: Conectric, LLC, Lewes, DE (US)

( * ) Notice: Subject to any disclaimer, the term of this patent is extended or adjusted under 35 U.S.C. 154(b) by 245 days.

(21) Appl. No.: 15/590,182

(22) Filed: May 9, 2017

(65) Prior Publication Data

US 2017/0329319 A1 Nov. 16, 2017

Related U.S. Application Data

(60) Provisional application No. 62/334,367, filed on May 10, 2016.

(51) Int. Cl.
*G05B 15/02* (2006.01)
*G06Q 10/06* (2012.01)
(Continued)

(52) U.S. Cl.
CPC ........ *G06Q 10/06312* (2013.01); *F24F 11/30* (2018.01); *F24F 11/62* (2018.01); *G01R 1/36* (2013.01); *G05B 13/041* (2013.01); *G05B 15/02* (2013.01); *G05B 19/042* (2013.01); *G05B 23/024* (2013.01); *G05B 23/0243* (2013.01); *G05B 23/0281* (2013.01); *G05B 23/0294* (2013.01); *G05F 1/66* (2013.01); *G06F 1/26* (2013.01); *G06F 17/18* (2013.01);
(Continued)

(58) Field of Classification Search
None
See application file for complete search history.

(56) References Cited

U.S. PATENT DOCUMENTS 6,968,295 B1 11/2005 Carr
7,664,573 B2 2/2010 Ahmed
(Continued)

FOREIGN PATENT DOCUMENTS

EP 2708403 A2 3/2014

*Primary Examiner* — Thomas C Lee
*Assistant Examiner* — Gary Collins
(74) *Attorney, Agent, or Firm* — Procopio, Cory, Hargreaves & Savitch LLP

(57) ABSTRACT

A computer-implemented method and system is provided. The system adaptively switches prediction strategies to optimize time-variant energy demand and consumption of built environments associated with renewable energy sources. The system analyzes a first, second, third, fourth and a fifth set of statistical data. The system derives of a set of prediction strategies for controlled and directional execution of analysis and evaluation of a set of predictions for optimum usage and operation of the plurality of energy consuming devices. The system monitors a set of factors corresponding to the set of prediction strategies and switches a prediction strategy from the set of derived prediction strategies. The system predicts a set of predictions for identification of a potential future time-variant energy demand and consumption and predicts a set of predictions. The system manipulates an operational state of the plurality of energy consuming devices and the plurality of energy storage and supply means.

20 Claims, 5 Drawing Sheets

(51) Int. Cl.
  G05F 1/66     (2006.01)
  H02J 3/14     (2006.01)
  G06F 17/18    (2006.01)
  H02J 3/00     (2006.01)
  G06Q 50/06    (2012.01)
  H02J 9/06     (2006.01)
  H02J 15/00    (2006.01)
  H02J 3/38     (2006.01)
  G06F 1/26     (2006.01)
  H02J 13/00    (2006.01)
  G05B 19/042   (2006.01)
  F24F 11/62    (2018.01)
  F24F 11/30    (2018.01)
  G05B 13/04    (2006.01)
  G05B 23/02    (2006.01)
  H02J 50/80    (2016.01)
  H02J 3/32     (2006.01)
  G01R 1/36     (2006.01)
  H02J 1/00     (2006.01)

(52) U.S. Cl.
  CPC .......... *G06Q 50/06* (2013.01); *H02J 3/00* (2013.01); *H02J 3/008* (2013.01); *H02J 3/14* (2013.01); *H02J 3/32* (2013.01); *H02J 3/382* (2013.01); *H02J 9/061* (2013.01); *H02J 13/0017* (2013.01); *H02J 13/0055* (2013.01); *H02J 13/0075* (2013.01); *H02J 13/0086* (2013.01); *H02J 15/00* (2013.01); *H02J 50/80* (2016.02); *G05B 2219/24048* (2013.01); *G05B 2219/2639* (2013.01); *H02J 3/383* (2013.01); *H02J 3/386* (2013.01); *H02J 2001/004* (2013.01); *H02J 2003/003* (2013.01); *H02J 2003/007* (2013.01); *H02J 2003/146* (2013.01); *Y02B 70/3225* (2013.01); *Y02E 10/563* (2013.01); *Y02E 10/566* (2013.01); *Y02E 10/763* (2013.01); *Y02E 40/72* (2013.01); *Y02E 40/76* (2013.01); *Y02E 70/30* (2013.01); *Y04S 10/123* (2013.01); *Y04S 10/54* (2013.01); *Y04S 10/545* (2013.01); *Y04S 10/60* (2013.01); *Y04S 20/222* (2013.01); *Y04S 20/224* (2013.01)

(56) References Cited

U.S. PATENT DOCUMENTS

| | | |
|---|---|---|
| 8,457,802 B1 | 6/2013 | Steven et al. |
| 8,799,481 B2 | 8/2014 | Chamarti et al. |
| 9,160,169 B2 | 10/2015 | Hanks et al. |
| 9,244,444 B2 | 1/2016 | Carty et al. |
| 9,906,029 B2 | 2/2018 | Grohman |
| 9,960,637 B2 | 5/2018 | Sanders et al. |
| 2006/0103549 A1 | 5/2006 | Hunt et al. |
| 2010/0138363 A1 | 6/2010 | Batterberry et al. |
| 2011/0169334 A1 | 7/2011 | Williams |
| 2011/0231028 A1 | 9/2011 | Ozog |
| 2011/0239013 A1 | 9/2011 | Muller |
| 2012/0232701 A1* | 9/2012 | Carty ............ G05B 15/02 700/277 |
| 2012/0239213 A1* | 9/2012 | Nagata ............ G06Q 10/04 700/291 |
| 2012/0245752 A1 | 9/2012 | Borrett et al. |
| 2012/0296482 A1 | 11/2012 | Steven et al. |
| 2012/0316808 A1 | 12/2012 | Frader-Thompson et al. |
| 2013/0000342 A1 | 1/2013 | Blasko et al. |
| 2013/0013121 A1* | 1/2013 | Henze ............ G06Q 10/04 700/291 |
| 2013/0218355 A1 | 8/2013 | Lazaris |
| 2014/0039710 A1* | 2/2014 | Carter ............ G06Q 10/06 700/291 |
| 2014/0141290 A1 | 5/2014 | Pizzurro et al. |
| 2014/0222225 A1 | 8/2014 | Rouse et al. |
| 2014/0277769 A1 | 9/2014 | Matsuoka et al. |
| 2014/0303935 A1 | 10/2014 | Kamel et al. |
| 2015/0057820 A1 | 2/2015 | Kefayati et al. |
| 2016/0104486 A1 | 4/2016 | Penilla et al. |
| 2016/0124411 A1 | 5/2016 | Tinnakornsrisuphap et al. |
| 2016/0190805 A1 | 6/2016 | Steven et al. |
| 2016/0248251 A1 | 8/2016 | Tinnakornsrisuphap et al. |
| 2017/0104449 A1* | 4/2017 | Drees ............ G01W 1/10 |
| 2017/0177766 A1* | 6/2017 | Song ............ G06F 17/11 |
| 2018/0107260 A1 | 4/2018 | Cifala et al. |
| 2018/0231967 A1 | 8/2018 | Cohen et al. |

* cited by examiner

METHOD AND SYSTEM FOR ADAPTIVELY SWITCHING PREDICTION STRATEGIES OPTIMIZING TIME-VARIANT ENERGY CONSUMPTION OF BUILT ENVIRONMENT

CROSS-REFERENCES TO RELATED APPLICATION

The present application claims the benefit under 35 U.S.C. § 119(e) of the filing date of U.S. Provisional Patent Application Ser. No. 62/334,367 for PHILLIP KOPP, filed May 10, 2016, which is hereby incorporated by reference in its entirety for all purposes.

TECHNICAL FIELD

The present disclosure relates to a field of energy management system. More specifically, the present disclosure relates to a method and system for adaptively switching prediction strategies to optimize time-variant energy demand and consumption of one or more built environments.

BACKGROUND

Over the last few decades, increasing population and energy requirements to power modern transportation and electronic technologies result in a rapid development in energy generation and distribution technology. In order to meet the energy generation and distribution requirements, energy utilities depend mostly on the non-renewable energy sources like fossil fuels which produce a high amount of carbon emissions. Refinement processes of fossil fuels and/or its by-products and their combustion to drive electric generators have contributed as one of the major cause of excessive carbon emissions. The release of carbon and other chemical by-products into the atmosphere has impacted temperatures and climate patterns on a global scale. The increased awareness of the impacts of carbon emissions from the use of fossil fueled electric generation along with the increased cost of producing high power during peak load conditions has increased the need for alternative solutions. These alternative solutions are referred to as renewable energy sources, which may be used to generate electricity. These renewable energy sources may be applied to electric drive trains, electric automation and transportation, without the need to extract, transport, refine, combust, and release carbon-based fossil fuels. Renewable energy comes in many forms, but significantly is generated by capturing energy from natural, non-carbon intensive sources such as wind, sunlight, water movement, geothermal and other new sources as they are discovered and improved. Unlike fossil fuels and/or its by-products, these renewable energy sources are complex in nature as they are intermittent and cannot be controlled actively by humans. This enhances the probability of occurrence of certain time periods where power production far exceeds demands or certain time periods where power production falls short of demands. This creates major challenges for energy utilities to make investments, generate power for sale and profit. Also, this creates major challenges for the markets in establishing a price of energy for consumers. Nowadays, energy storage means are deployed to store energy when power production is excessive and release energy when demands exceed power production output. These energy storage means include but may not be limited to batteries and sophisticated power banks. However, there are many limitations to the effective installation of the energy storage means due to sizing requirements, specific load profiles and other attributes which must be matched very carefully in order to provide feasible economic returns.

SUMMARY

In a first example, a computer-implemented method is provided. The computer-implemented method adaptively switches prediction strategies to optimize time-variant energy demand and consumption of one or more built environments associated with renewable energy sources. The computer-implemented method may include a first step of analysis of a first set of statistical data, a second set of statistical data, a third set of statistical data, a fourth set of statistical data and a fifth set of statistical data. The first set of statistical data may be associated with a plurality of energy consuming devices. The second set of statistical data may be associated with an occupancy behavior of a plurality of users. The third set of statistical data may be associated with a plurality of energy storage and supply means. The fourth set of statistical data may be associated with a plurality of environmental sensors and the fifth set of statistical data may be associated with a plurality of energy pricing models. In addition, the computer-implemented method may include a second step of derivation of a set of prediction strategies. The set of prediction strategies enable controlled and directional execution of analysis and evaluation of a set of predictions for optimum usage and operation of the plurality of energy consuming devices. Moreover, the computer-implemented method may include a third step to monitor a set of factors corresponding to the set of prediction strategies discretely indicating prominence of the set of prediction strategies. Further, the computer-implemented method may include a fourth step to switch to a prediction strategy from the set of derived prediction strategies. Furthermore, the computer-implemented method may include a fifth step of prediction of a set of predictions for identifying a potential future time-variant energy demand and consumption associated with the one or more built environments. Also, the computer-implemented method may include a fifth step of prediction of a set of predictions for identification of a potential future time-variant energy demand and consumption associated with the one or more built environments. In addition, the computer-implemented method may include a sixth step of manipulation an operational state of the plurality of energy consuming devices and the plurality of energy storage and supply means. The analysis may be done by performing one or more statistical functions to generate a plurality of statistical results. The switching may be performed based on selective prominence of one or more factors in the monitored set of factors corresponding to switched predication strategy of the one or more prediction strategies. The manipulation may be performed based on the set of predictions. The operational state of the plurality of energy consuming devices may be manipulated by time-variant shifting and scheduling of operation of each of the selected energy consuming device of the plurality of energy consuming devices in a scheduled usage profile of the selected energy consuming device of the plurality of energy consuming devices. The time-variant shifting and scheduling may be performed for regulation of the usage profile and rendering steeper energy demand curves for the one or more built environments. In addition, the manipulation may be done by integration of energy storage and supply means for optimally reducing a peak level of energy demand concentrated over a limited period of time. The integration is done based on validation of an increase in the energy demand above a threshold level. The energy storage and supply means may be integrated for providing an energy demand reduction from an energy storage device with lower energy storage capacity. The demand reduction from the energy storage device provides a potential for optimum discharge over a period of time.

In a second example, a computer system is provided. The computer system may include one or more processors and a memory coupled to the one or more processors. The memory may store instructions which, when executed by the one or more processors, may cause the one or more processors to perform a method. The method adaptively switches prediction strategies to optimize time-variant energy demand and consumption of one or more built environments associated with renewable energy sources. The method may include a first step of analysis of a first set of statistical data, a second set of statistical data, a third set of statistical data, a fourth set of statistical data and a fifth set of statistical data. The first set of statistical data may be associated with a plurality of energy consuming devices. The second set of statistical data may be associated with an occupancy behavior of a plurality of users. The third set of statistical data may be associated with a plurality of energy storage and supply means. The fourth set of statistical data may be associated with a plurality of environmental sensors and the fifth set of statistical data may be associated with a plurality of energy pricing models. In addition, the method may include a second step of derivation of a set of prediction strategies. The set of prediction strategies enable controlled and directional execution of analysis and evaluation of a set of predictions for optimum usage and operation of the plurality of energy consuming devices. Moreover, the method may include a third step to monitor a set of factors corresponding to the set of prediction strategies discretely indicating prominence of the set of prediction strategies. Further, the method may include a fourth step to switch to a prediction strategy from the set of derived prediction strategies. Furthermore, the method may include a fifth step of prediction of a set of predictions for identifying a potential future time-variant energy demand and consumption associated with the one or more built environments. Also, the method may include a fifth step of prediction of a set of predictions for identification of a potential future time-variant energy demand and consumption associated with the one or more built environments. In addition, the method may include a sixth step of manipulation of an operational state of the plurality of energy consuming devices and the plurality of energy storage and supply means. The analysis may be done by performing one or more statistical functions to generate a plurality of statistical results. The switching may be performed based on selective prominence of one or more factors in the monitored set of factors corresponding to switched predication strategy of the one or more prediction strategies. The manipulation may be performed based on the set of predictions. The operational state of the plurality of energy consuming devices may be manipulated by time-variant shifting and scheduling of operation of each of the selected energy consuming device of the plurality of energy consuming devices in a scheduled usage profile of the selected energy consuming device of the plurality of energy consuming devices. The time-variant shifting and scheduling may be performed for regulation of the usage profile and rendering steeper energy demand curves for the one or more built environments. In addition, the manipulation may be done by integration of energy storage and supply means for optimally reducing a peak level of energy demand concentrated over a limited period of time. The integration is done based on validation of an increase in the energy demand above a threshold level. The energy storage and supply means may be integrated for providing an energy demand reduction from an energy storage device with lower energy storage capacity. The demand reduction from the energy storage device provides a potential for optimum discharge over a period of time.

In a third example, a computer-readable storage medium is provided. The computer-readable storage medium encodes computer executable instructions that, when executed by at least one processor, performs a method. The method adaptively switches prediction strategies to optimize time-variant energy demand and consumption of one or more built environments associated with renewable energy sources. The method may include a first step of analysis of a first set of statistical data, a second set of statistical data, a third set of statistical data, a fourth set of statistical data and a fifth set of statistical data. The first set of statistical data may be associated with a plurality of energy consuming devices. The second set of statistical data may be associated with an occupancy behavior of a plurality of users. The third set of statistical data may be associated with a plurality of energy storage and supply means. The fourth set of statistical data may be associated with a plurality of environmental sensors and the fifth set of statistical data may be associated with a plurality of energy pricing models. In addition, the method may include a second step of derivation of a set of prediction strategies. The set of prediction strategies enable controlled and directional execution of analysis and evaluation of a set of predictions for optimum usage and operation of the plurality of energy consuming devices. Moreover, the method may include a third step to monitor a set of factors corresponding to the set of prediction strategies discretely indicating prominence of the set of prediction strategies. Further, the method may include a fourth step to switch to a prediction strategy from the set of derived prediction strategies. Furthermore, the method may include a fifth step of prediction of a set of predictions for identifying a potential future time-variant energy demand and consumption associated with the one or more built environments. Also, the method may include a fifth step of prediction of a set of predictions for identification of a potential future time-variant energy demand and consumption associated with the one or more built environments. In addition, the method may include a sixth step of manipulation of an operational state of the plurality of energy consuming devices and the plurality of energy storage and supply means. The analysis may be done by performing one or more statistical functions to generate a plurality of statistical results. The switching may be performed based on selective prominence of one or more factors in the monitored set of factors corresponding to switched predication strategy of the one or more prediction strategies. The manipulation may be performed based on the set of predictions. The operational state of the plurality of energy consuming devices may be manipulated by time-variant shifting and scheduling of operation of each of the selected energy consuming device of the plurality of energy consuming devices in a scheduled usage profile of the selected energy consuming device of the plurality of energy consuming devices. The time-variant shifting and scheduling may be performed for regulation of the usage profile and rendering steeper energy demand curves for the one or more built environments. In addition, the manipulation may be done by integration of energy storage and supply means for optimally reducing a peak level of energy demand concentrated over a limited period of time. The integration is done based on validation of an increase in the energy demand above a threshold level. The energy storage and supply means may be integrated for providing an energy demand reduction from an energy storage device with lower energy storage capacity. The demand reduction from the energy storage device provides a potential for optimum discharge over a period of time.

BRIEF DESCRIPTION OF THE FIGURES

Figure 1:
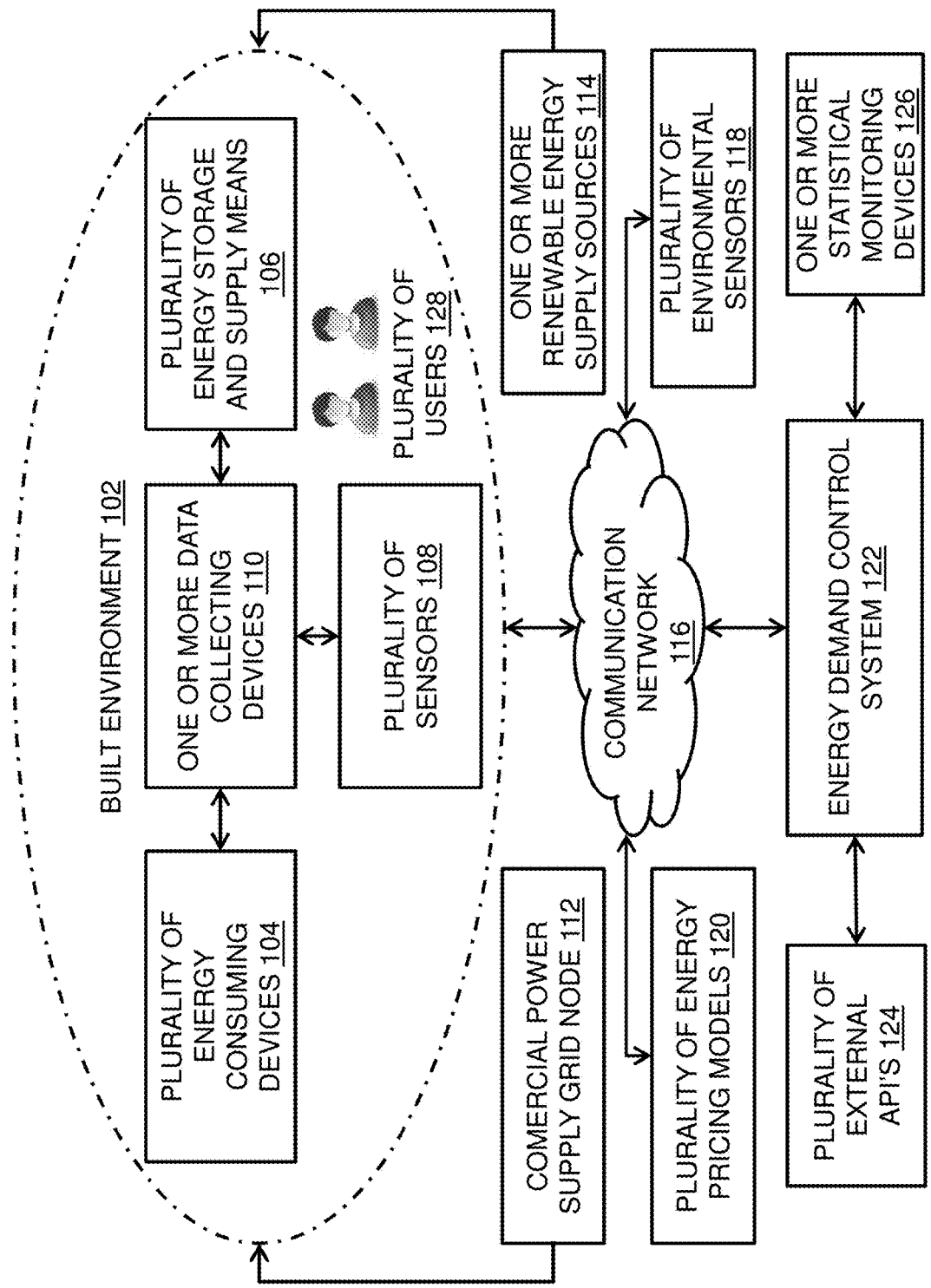
Figure 2:
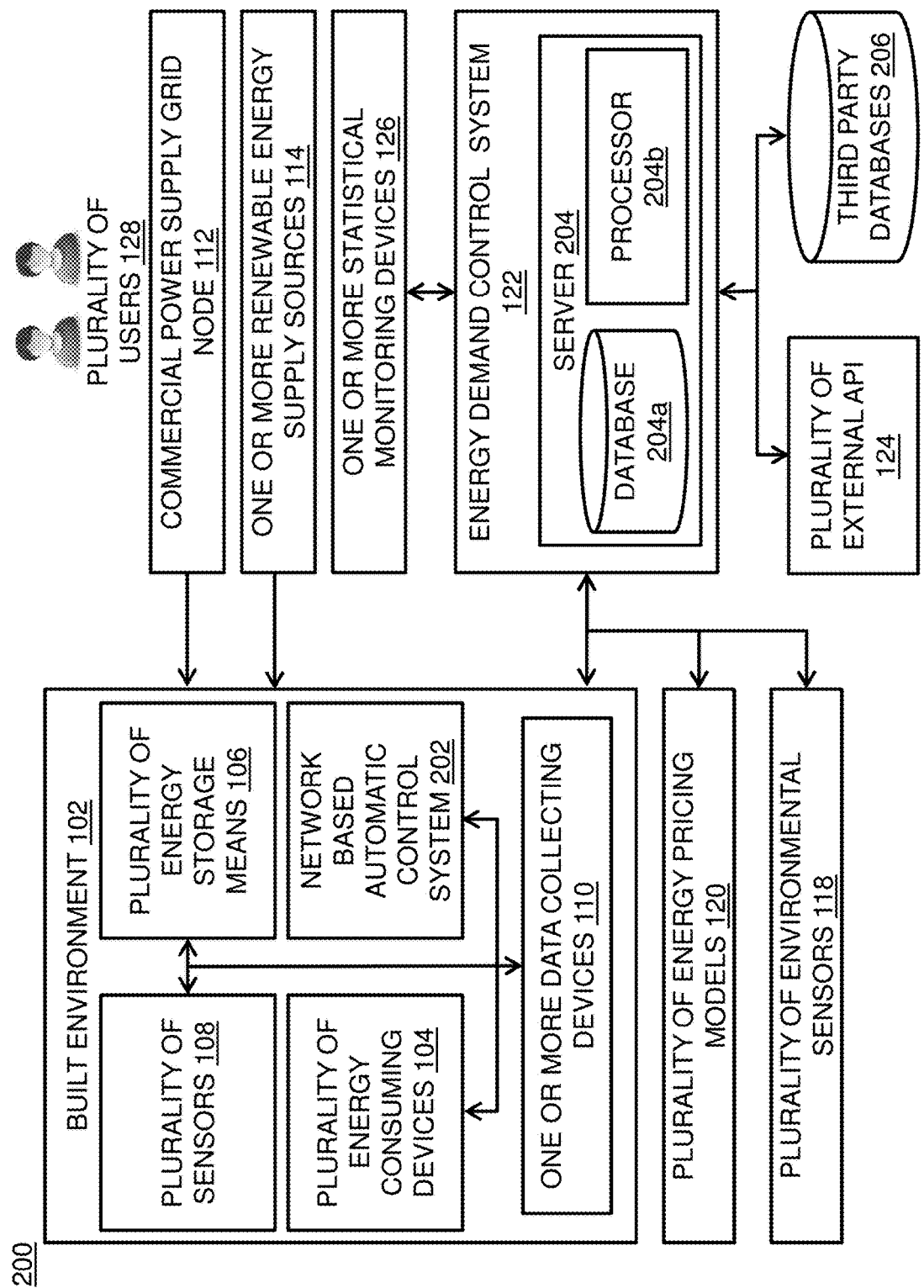
Figure 3:
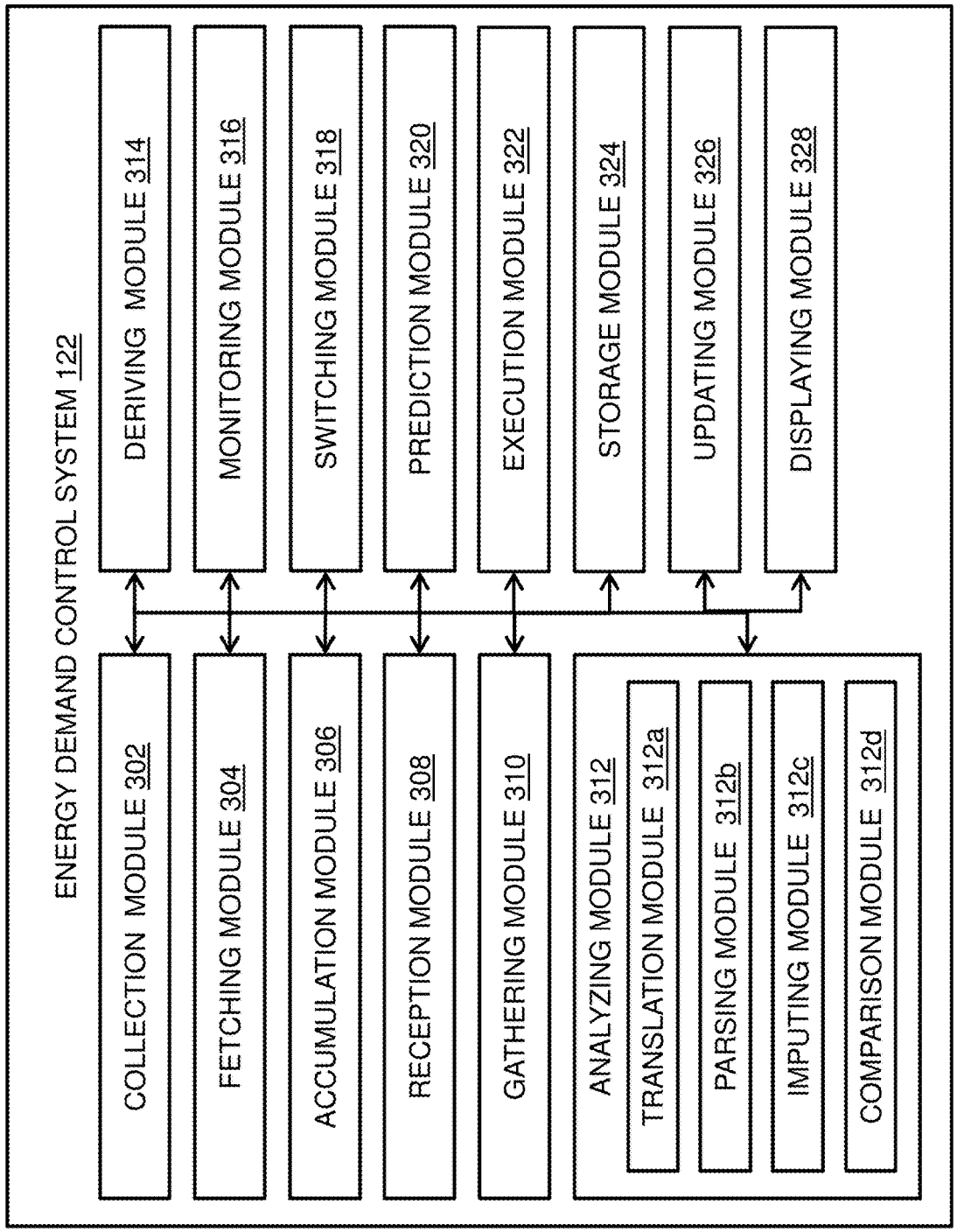
Figure 4:
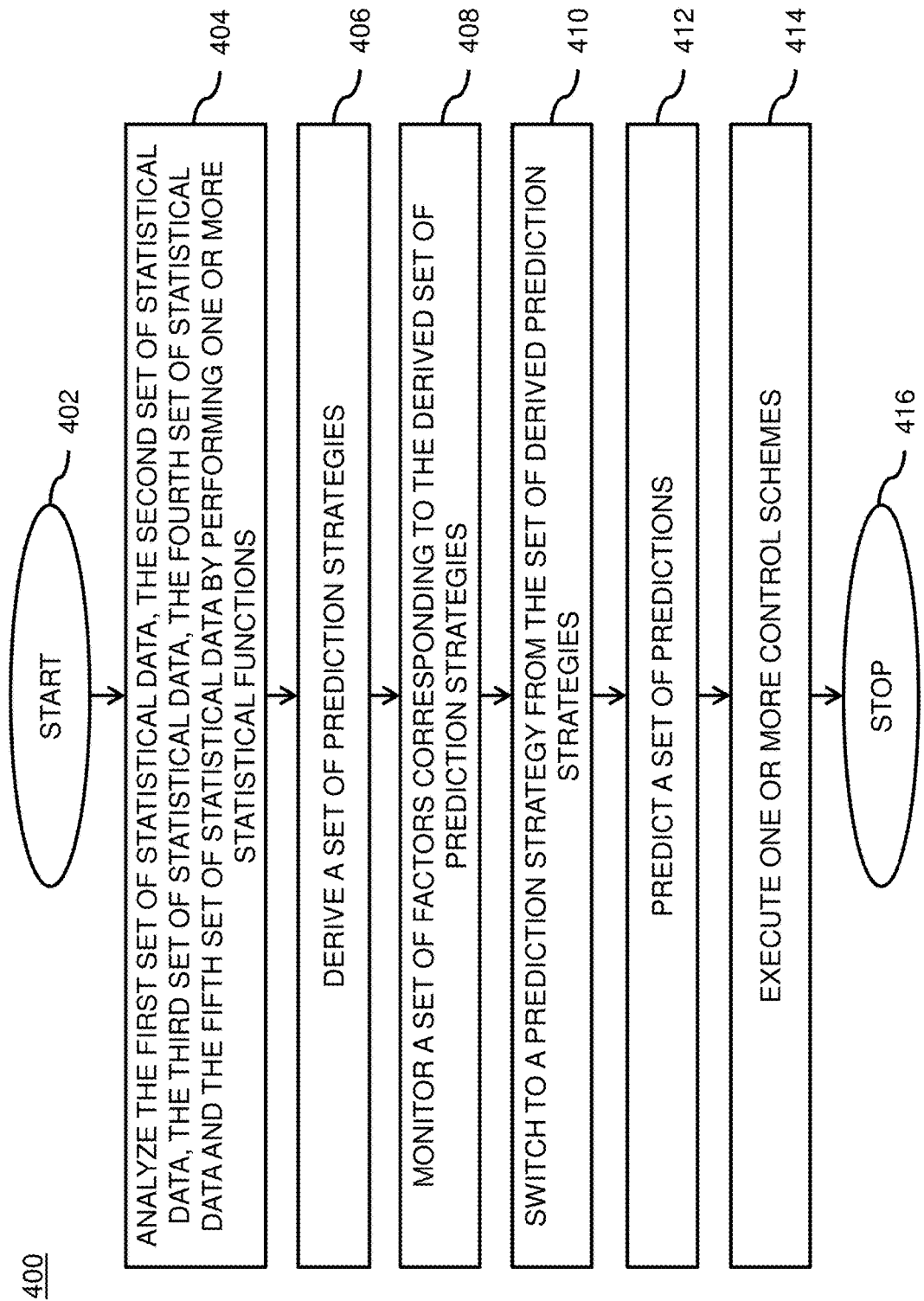
Figure 5:
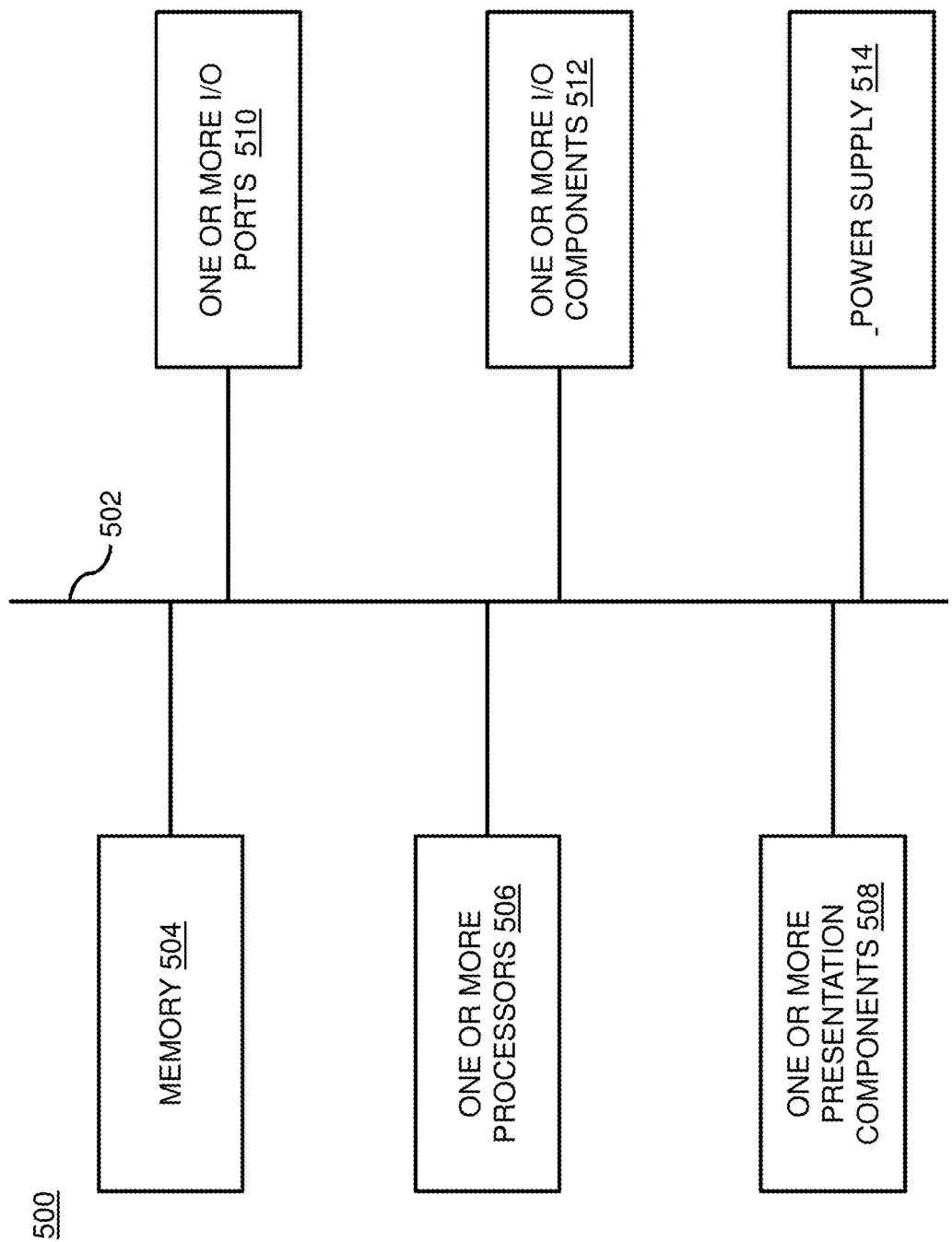

Having thus described the invention in general terms, reference will now be made to the accompanying drawings, which are not necessarily drawn to scale, and wherein:

FIG. 1 illustrates an interactive environment for adaptively switching prediction strategies to optimize time-variant energy demand and consumption of one or more built environments, in accordance with various embodiments of the present disclosure;

FIG. 2 illustrates a block diagram for adaptively switching prediction strategies to optimize time-variant energy demand and consumption of one or more built environments, in accordance with various embodiments of the present disclosure;

FIG. 3 illustrates a block diagram of an energy demand control system, in accordance with various embodiments of the present disclosure;

FIG. 4 illustrates a flow chart for adaptively switching prediction strategies to optimize time-variant energy demand and consumption of one or more built environments, in accordance with various embodiments of the present disclosure; and FIG. 5 illustrates a block diagram of a communication device, in accordance with various embodiments of the present disclosure.

It should be noted that the accompanying figures are intended to present illustrations of exemplary embodiments of the present disclosure. These figures are not intended to limit the scope of the present disclosure. It should also be noted that accompanying figures are not necessarily drawn to scale.

DETAILED DESCRIPTION

In the following description, for purposes of explanation, numerous specific details are set forth in order to provide a thorough understanding of the present technology. It will be apparent, however, to one skilled in the art that the present technology can be practiced without these specific details. In other instances, structures and devices are shown in block diagram form only in order to avoid obscuring the present technology.

Reference in this specification to "one embodiment" or "an embodiment" means that a particular feature, structure, or characteristic described in connection with the embodiment is included in at least one embodiment of the present technology. The appearance of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

Moreover, although the following description contains many specifics for the purposes of illustration, anyone skilled in the art will appreciate that many variations and/or alterations to said details are within the scope of the present technology. Similarly, although many of the features of the present technology are described in terms of each other, or in conjunction with each other, one skilled in the art will appreciate that many of these features can be provided independently of other features. Accordingly, this description of the present technology is set forth without any loss of generality to, and without imposing limitations upon, the present technology.

FIG. 1 illustrates an interactive environment for adaptively switching prediction strategies to optimize time-variant energy demand and consumption associated with one or more built environments, in accordance with various embodiment of the present disclosure. The interactive environment facilitates assimilation and analysis of energy conditions associated with the one or more built environments. The energy conditions include but may not be limited to energy demand, energy consumption, energy expenses and energy use intensity. The analyzed energy conditions are utilized for deriving and switching prediction strategies for precisely predicting a set of predictions associated with the potential future time-variant energy demand and consumption. In addition, the set of predictions are utilized to accurately manipulate the energy demand and consumption rendering steeper energy demand curves to optimize the time-variant energy demand and consumption.

The interactive environment is characterized by the interaction of a built environment 102, a plurality of energy consuming devices 104, a plurality of energy storage and supply means 106, a plurality of sensors 108 and one or more data collecting devices 110. In addition, the interactive environment is characterized by the interaction of a commercial power supply grid node 112, one or more renewable energy supply sources 114 and a communication network 116. Furthermore, the interactive environment is characterized by the interaction of a plurality of environmental sensors 118 and a plurality of energy pricing models 120. Moreover, the interactive environment is characterized by the interaction of an energy demand control system 122, a plurality of external application program interfaces 124 (hereafter "APIs") and one or more statistical monitoring devices 126.

In general, the built environment 102 is a closed or semi-closed structure with one or more number of floors utilized for specific purposes. Each built environment are utilized to perform a pre-defined operations and maintenance based on types of services provided by the built environment 102. The types of services include hospitality, travel, work, entertainment, manufacturing and the like. In addition, each type of service provided decides a scale of the operations and maintenance of the built environment 102. The type of services and the maintenance pertains to the energy consumption associated with each of the plurality of energy consuming devices 104. Examples of the built environment 102 include but may not be limited to an office, a mall, an airport, a stadium, a hotel and a manufacturing plant.

The built environment 102 utilizes energy for operations and maintenance of the built environment 102. The built environment 102 obtains the energy from a plurality of energy generation and supply sources. The plurality of energy generation and supply sources include but may not be limited to the commercial power supply grid node 112 and the one or more renewable energy supply sources 114. The commercial power supply grid node 112 corresponds to a network of power lines, a plurality of transformers and one or more equipment employed for the transmission and distribution of the alternate current power to the built environment 102. Further, the one or more renewable energy supply sources 114 include but may not be limited to one or more windmills and plurality solar photovoltaic panels.

In an embodiment of the present disclosure, the one or more renewable energy supply sources 114 are deployed at the built environment 102. In an example, the plurality of solar photovoltaic panels is installed at the residential or commercial rooftops. In another embodiment of the present disclosure, the one or more renewable energy supply sources 114 are deployed at a remote location from the built environment 102. In an example, the one or more windmills are deployed at countryside farmland. In an embodiment of the present disclosure, the one or more renewable energy supply sources 114 is directly connected to the plurality of energy storage and supply means 106 associated with the built environment 102. The one or more renewable energy supply sources 114 directly provides DC energy to the plurality of energy storage and supply means 106 without going through any voltage or current conversion process. In another embodiment of the present disclosure, the one or more renewable energy supply sources 114 is connected with the built environment 102 to supply available energy through the use of a direct current to alternating current inverter.

The plurality of energy storage and supply means 106 is configured to store the energy and supply to fulfill energy demand associated with the built environment 102. In an embodiment of the present disclosure, the plurality of energy storage and supply means 106 includes one or more battery cells assembled to create one or more battery packs capable of charging and discharging electric energy. In another embodiment of the present disclosure, the plurality of energy storage and supply means 106 is a high speed flywheel energy storage means. In yet another embodiment of the present disclosure, the plurality of energy storage and supply means 106 is pumped hydro energy storage means.

In yet another embodiment of the present disclosure, the plurality of energy storage and supply means 106 is non-electrical energy storing mediums. In an example, the energy storage and supply means may be comprised of thermal mass or momentum, such that the calculated amount of energy as converted to heat is stored within the energy storage and supply means. In addition, the energy is stored and released at a certain rate using heat transfer or pumping as an energy transfer medium. In another example, a building environment, its construction, envelope and contents are utilized as a means to store, transfer and release energy passively or actively in a form of heat when combined with a means of artificial heating and cooling.

In an embodiment of the present disclosure, the plurality of energy storage and supply means 106 is located at a central location in the built environment 102. The central location associated with the built environment 102 includes an electrical room or closet, exterior in a specialized storage cabinet or container and the like. In another embodiment of the present disclosure, the plurality of energy storage and supply means 106 is co-located with each of the plurality of energy consuming devices 104. In yet another embodiment of the present disclosure, the plurality of energy storage and supply means 106 is distributed throughout the built environment 102. In an example, the plurality of energy storage and supply means 106 is distributed in stand-alone forms, plug-in forms and design oriented forms such as furniture or permanent wall hanging forms or picture frames.

In yet another embodiment of the present disclosure, the plurality of energy storage and supply means 106 is built into the building structure or building electrical distribution itself. In yet another embodiment of the present disclosure, the plurality of energy storage and supply means 106 is in a form of thermal heat mass capture and release using calculated capacities of building materials. In yet another embodiment of the present disclosure, the plurality of energy storage and supply means 106 is located outside of the built environment 102 in a micro-grid or fractal grid application.

Going further, the built environment 102 is associated with a plurality of users 128 present inside the built environment 102. The plurality of users 128 may be any human operator, human worker, occupants, data manager, visitors and the like. Each of the plurality of users 128 is associated with a task. For example, the human operators perform the task of monitoring and regulating machines. In another example, the human workers perform the task of cleaning, sweeping and repairing. In yet another example, the occupants are the employees that include managers, attendants, assistants, clerk, security staff and the like. In yet another example, the visitors are civilians present for a specific period of time.

Each of the plurality of users 128 utilizes a pre-defined amount of the energy. The pre-defined amount of the energy pertains to a corresponding energy consuming device of the plurality of energy consuming devices 104. Moreover, each of the plurality of energy consuming devices 104 performs an operation to meet requirements of the plurality of operations associated with the built environment 102. The plurality of operations is associated with operation of each of the plurality of energy consuming devices 104 installed in the built environment 102. The plurality of energy consuming devices 104 may be of any type and size. In addition, the plurality of energy consuming devices 104 includes a plurality of electrical devices and a plurality of portable communication devices.

In an embodiment of the present disclosure, the plurality of energy consuming devices 104 may have any electrical and mechanical applications. Examples of the plurality of energy consuming devices 104 include but may not be limited to lighting circuits, refrigeration units, air conditioning systems, information technology networks, gas boilers, hot water heater, escalators, and elevators. The plurality of energy consuming devices 104 consumes a pre-defined amount of the energy based on a power rating, duration of energy usage and the plurality of operations performed. The pre-defined amount of the energy consumed by the plurality of energy consuming devices 104 is based on one or more energy physical variables. The one or more energy physical variables include but may not be limited to a power factor, a phase angle, a power frequency, a voltage, a current load and a power demand.

The one or more energy physical variables of each of the plurality of energy consuming devices 104 is monitored and measured by a plurality of energy metering devices. Each of the plurality of energy consuming devices 104 is combined with the plurality of energy metering devices. In an embodiment of the present disclosure, the plurality of energy metering devices is installed inside each of the plurality of energy consuming devices 104. The plurality of energy metering devices measures each of the one or more energy physical variables in real time. The plurality of energy metering devices include but may not be limited to digital multi-meters, current sensors and wattage meters. In addition, the plurality of energy metering devices facilitates collection of a first set of statistical data associated with the plurality of energy consuming devices 104.

The collection of the first set of statistical data uses a method. In an embodiment of the present disclosure, the method involves digital collection of the first set of statistical data for each of the plurality of energy consuming devices 104. In another embodiment of the present disclosure, the method involves physical collection of the first set of statistical data for each of the plurality of energy consuming devices 104. The plurality of energy metering devices monitors a first plurality of parameters. The first plurality of parameters is associated with the plurality of energy consuming devices 104. The first plurality of parameters includes a set of operational characteristics and a set of physical characteristics. The set of operational characteristics include a current rating, a voltage rating, a power rating, a frequency of operation, an operating temperature and a device temperature. In addition, the set of operational characteristics include duration of the energy usage by each of the plurality of energy consuming devices 104 in the built environment 102. Moreover, the set of operational characteristics include a seasonal variation in operation and an off-seasonal variation in operation. Further, the set of physical characteristics include a device size, a device area, a device physical location and a portability of device. In an embodiment of the present disclosure, the one or more energy metering devices collects the first set of statistical data. In addition, the first set of statistical data includes a current operational state data and a past operational state data. The current operational state data and the past operational state data corresponds to current energy consumption data and the historical energy consumption data associated with the plurality of energy consuming devices 104 of the built environment 102.

Going further, the plurality of energy consuming devices 104 is associated with the plurality of users 128. The plurality of users 128 interacts with the plurality of energy consuming devices 104 installed in the built environment 102 to perform specific operations. The daily usage and the operating characteristics of the plurality of energy consuming devices 104 are derived from an interface associated with each user of the plurality of users 128. Each of the plurality of energy consuming devices 104 consumes a pre-defined amount of energy during the interface. The pre-defined amount of energy is derived based on an energy consumption behavior and an occupancy pattern of each of the plurality of users 128. In an example, each user of the plurality of users 128 in the built environment 102 may arrive and leave the built environment 102 during certain hours each day. Each user carries one or more portable communication devices both in and out of the built environment 102.

Further, the energy consumption behavior and the occupancy pattern is recorded for each of the plurality of users 128 to obtain a second set of statistical data. The energy consumption behavior and occupancy pattern is collected and recorded by a plurality of occupancy detection means. The plurality of occupancy detection means collect the energy consumption behavior and occupancy pattern associated with the plurality of users 128 in real time. The plurality of occupancy detection means are installed inside and outside of the built environment 102. The plurality of occupancy detection means include a plurality of occupancy sensing devices. The plurality of occupancy sensing devices include occupancy sensors, door state sensors, motion detectors, microphones, radio frequency identification (hereinafter as "RFID"), radio received signal strength indicators (hereinafter as "RSSI") and digital or radio frequency signal processors. Furthermore, the plurality of occupancy detection means include the plurality of sensors 108. The plurality of sensors 108 include carbon-monoxide sensors, carbon-dioxide sensors, heat sensors, pressure sensors, atmospheric pressure sensors, temperature sensors, energy flow sensors, energy fingerprint sensors on monitored loads physical touch point sensors and the like.

The first set of statistical data and the second set of statistical data is transferred to the one or more data collecting devices 110 associated with the built environment 102. The one or more data collecting devices 110 collects the first set of statistical data and the second set of statistical data. The one or more data collecting devices 110 perform digital collection and manual collection. In an embodiment of the present disclosure, each of the one or more data collecting devices 110 is a portable device with an inbuilt API. The inbuilt API of each of the one or more data collection devices 110 is associated with a Global Positioning system (hereafter "GPS"). Further, the inbuilt API of each of the one or more data collection devices 110 is associated with a camera and keypad designed for manual data input from the plurality of users 128. In another embodiment of the present disclosure, each of the one or more data collecting devices 110 is a cellular modem. In yet another embodiment of the present disclosure, each of the one or more data collecting devices 110 is any suitable data gateway device.

The one or more data collecting devices 110 collects a third set of statistical data associated with each of the plurality of energy storage and supply means 106. In an embodiment of the present disclosure, the one or more data collecting devices 110 receives the third set of statistical data from the plurality of energy monitoring devices associated with each of the plurality of energy storage and supply means 106. The plurality of energy monitoring devices monitor a second plurality of parameters associated with the plurality of energy storage and supply means 106. In addition, the plurality of energy monitoring devices collect and transfer the second plurality of parameters associated with the plurality of energy storage and supply means 106 to the one or more data collecting devices 110 in real time. The second plurality of parameters include but may not be limited to charging and discharging rates, temperature characteristics, an energy storage and release capacity associated with the plurality of energy storage.

The one or more data collecting devices 110 is associated with the communication network 116 through an internet connection. The internet connection is established based on a type of network. In an embodiment of the present disclosure, the type of network is a wireless mobile network. In another embodiment of the present disclosure, the type of network is a wired network with a finite bandwidth. In yet another embodiment of the present disclosure, the type of network is a combination of the wireless and the wired network for the optimum throughput of data transmission. The communication network 116 includes a set of channels with each channel of the set of channels supporting a finite bandwidth. The finite bandwidth of each channel of the set of channels is based on a capacity of the communication network 116. The communication network 116 transmits a pre-defined size of the first set of statistical data, the second set of statistical data and the third set of statistical data to the energy demand control system 122. The pre-defined size corresponding to the first set of statistical data, the second set of statistical data and the third set of statistical data is measured in terms of at least one of bits, bytes, kilobytes, megabytes, gigabytes, terabytes and petabytes. Accordingly, the energy demand control system 122 receives the pre-defined size of the first set of statistical data, the second set of statistical data and the third set of statistical data. In addition, the energy demand control system 122 receives another part of the first set of statistical data, the second set of statistical data and the third set of statistical data from the plurality of external APIs 124 and third party databases.

Continuing with FIG. 1, the energy demand control system 122 receives a fourth set of statistical data and a fifth set of statistical data. The energy demand control system 122 receives the fourth set of statistical data from the plurality of environmental sensors 118 through the communication network 116. The plurality of environmental sensors 118 detect and collect environmental and weather conditions associated with the built environment 102 in real time. In addition, the plurality of environmental sensors 118 transfer the environmental and weather conditions to the energy demand control system 122 in real time. In an embodiment of the present disclosure, the plurality of environmental sensors 118 is present inside the built environment 102. In another embodiment of the present disclosure, the plurality of environmental sensors 118 is present outside the built environment 102. Further, the energy demand control system 122 receives the fifth set of statistical data from the plurality of energy pricing models 120. The plurality of energy pricing models 120 is configured to record energy prices associated with the built environment 102.

The energy demand control system 122 receives another part of the fourth set of statistical data and the fifth set of statistical data from the plurality of external APIs 124 and third party databases. The plurality of external APIs 124 and the third party databases are configured to collect, store and transmit weather history and weather forecasts. In addition, the plurality of external APIs 124 and the third party databases are configured to collect, store and transmit billing data, a past energy consumption data and metered energy data. Furthermore, the plurality of external APIs 124 and the third party databases are configured to collect, store and transmit financial or non-financial business data. The financial or non-financial business data comes from business management software. Example of the business management software includes Enterprise Resources Planning (ERP) software.

The energy demand control system 122 analyzes the first set of statistical data, the second set of statistical data, the third set of statistical data, the fourth set of statistical data and the fifth set of statistical data. The analysis is done by performing one or more statistical functions (discussed below in detailed description of FIG. 2). The energy demand control system 122 performs the one or more statistical functions to generate a plurality of statistical results. The plurality of statistical results pertains to the energy consumption (discussed below in detailed description of FIG. 2). The plurality of statistical results obtained from the analysis is used as a reference basis of the energy consumption for deriving a set of prediction strategies (discuss in detailed description of FIG. 2). Further, the energy demand control system 122 switch to a prediction strategy from the set of prediction strategies based on a selective prominence of one or more factors (explained in detailed description of FIG. 1). The switching is performed to precisely predict and manipulate the time-variant energy demand and consumption of the built environment 102

Further, the energy demand control system 122 displays the plurality of statistical results through an application installed in a mobile phone, tablet, smart watch and the like. In another embodiment of the present disclosure, the energy demand control system 122 displays each of the plurality of statistical results on a web page. In yet another embodiment of the present disclosure, the energy demand control system 122 displays each of the plurality of statistical results on a plurality of monitors. Furthermore, the energy demand control system 122 executes the one or more control schemes for controlling the operational states of each of the plurality of energy consuming devices 104 and the plurality of energy storage and supply means 106. The one or more control schemes are executed based on the set of predictions (explained below in the detailed description of the FIG. 2).

Further, the energy demand control system 122 transfers the plurality of statistical results along with the set of predictions and the one or more control schemes to the one or more statistical monitoring devices 126. The one or more statistical monitoring devices 126 is configured to receive and display at least one of the first set of statistical data, the second set of statistical data, the third set of statistical data, the fourth set of statistical data and the fifth set of statistical data. In addition, the one or more statistical monitoring devices 126 are configured to receive and display at least one of the plurality of statistical results, the set of predictions and the one or more control schemes for precise monitoring and manipulation. The one or more statistical monitoring devices 126 is a device capable of receiving the first set of statistical data, the second set of statistical data, the third set of statistical data, the fourth set of statistical data and the fifth set of statistical data from the energy demand control system 122. Also, the one or more statistical monitoring devices 126 is a device capable of receiving the plurality of statistical results, the set of predictions and the one or more control schemes from the energy demand control system 122.

It may be noted that in FIG. 1, the energy demand control system 122 transfers the first set of statistical data, the second set of statistical data, the third set of statistical data, the fourth set of statistical data, the fifth set of statistical data, the plurality of statistical results, the set of predictions and the one or more control schemes to the one or more statistical monitoring devices 126; however, those skilled in the art would appreciate that the energy demand control system 122 transfers the first set of statistical data, the second set of statistical data, the third set of statistical data, the fourth set of statistical data, the fifth set of statistical data, the plurality of statistical results, the set of predictions and the one or more control schemes to more number of statistical monitoring devices. Furthermore, it may be noted that in FIG. 1, the built environment 102 is connected to the energy demand control system 122 through the communication network 116; however, those skilled in the art would appreciate that more number of built environments are connected to the energy demand control system 122 through the communication network 116.

FIG. 2 illustrates a block diagram 200 for adaptively switching prediction strategies to optimize time-variant energy demand and consumption of the built environment 102, in accordance with various embodiments of the present disclosure. It may be noted that to explain the system elements of FIG. 2, references will be made to the system elements of the FIG. 1.

The block diagram 200 includes the built environment 102, commercial power supply grid node 112, the one or more renewable energy supply sources 114, the energy demand control system 122 and the plurality of external APIs 124 (as discussed above in detailed description of FIG. 1). In addition, the block diagram 200 includes the plurality of environmental sensors 118 and the plurality of energy pricing models 120 and the one or more statistical monitoring devices 126 (as discussed above in detailed description of FIG. 1). Moreover, the block diagram 200 includes a network based automatic control system 202 and third party databases 206. Furthermore, the energy demand control system 122 includes a server 204. In addition, the server 204 includes a database 204a and a processor 204b.

Each of the plurality of energy consuming devices 104 is associated with one or more energy physical variables (as described above in detailed description of FIG. 1). The one or more energy physical variables defines the energy consumption in the real time based on the load. In an embodiment of the present disclosure, each of the plurality of energy consuming devices 104 is associated with the plurality of energy metering devices. The plurality of energy metering devices digitally measures one or more energy physical variables in the real time to obtain the first set of statistical data (as discussed above in detailed description of FIG. 1). The plurality of energy metering devices includes one or more digital meters, one or more digital current and voltage sensors, the multi-meters, watt-meters, supervisory control and data acquisition (SCADA) and the like.

The energy demand control system 122 collects the first set of statistical data associated with the plurality of energy consuming devices 104 from the plurality of energy metering devices. The first set of statistical data includes the current operational state data associated with the plurality of energy consuming devices 104 and the past operational state data associated with the plurality of energy consuming devices 104. The operational state data is associated with the pre-defined amount of energy consume by each of the plurality of energy consuming devices 104 in real time. The plurality of energy consuming devices 104 consumes the pre-defined amount of energy to perform a specific operation (as discussed above in detailed description of FIG. 1).

Further, the energy demand control system 122 fetches the second set of statistical data associated with an occupancy behavior of the plurality of users 128 present inside each of the built environment 102. The energy demand control system 122 fetches the second set of statistical data from the plurality of occupancy detection means. The second set of statistical data includes a first plurality of occupancy data and a second plurality of occupancy data. The first plurality of occupancy data is associated with energy consumption behavior of each of the plurality of users 128 present inside the built environment 102. The second plurality of occupancy data is associated with the occupancy pattern of each of the plurality of users 128 present inside the built environment 102.

The first plurality of occupancy data is associated with interaction between the plurality of energy consuming devices 104 and the plurality of users 128. In an example, a person X check-in to a hotel A. The person X uses the elevator to go upstairs, unlock the room by digital card swap and turns on the lighting and air conditioning unit. The interaction of the person X with the elevator, the digital card swaps door, the lightings and the air conditioning unit results in the pre-defined load consumption. The plurality of users 128 consumes the pre-defined amount of energy associated with the built environment 102.

The second plurality of occupancy data is associated with the occupancy pattern of the plurality of users 128. The occupancy pattern of the plurality of users 128 varies with time, location, weather, season and the like. The occupancy pattern of the plurality of users 128 varies with different zones of the built environment 102. In an example, the occupancy pattern of the plurality of users 128 in shopping malls increases during the festive seasons. In another example, the occupancy pattern at the rugby ground increases during the match day.

The energy consumption behavior and occupancy pattern is recorded and counted by the plurality of occupancy detection means to obtain the second set of statistical data (as described above in detailed description of FIG. 1). In addition, the plurality of occupancy detection means record and count based on the one or more specifications. The one or more specifications include heat signature, identification cards, Bluetooth and the like. In an example, the record of first time visitors and frequent visitors is maintained for faster collection of the second set of statistical data. Further, the energy usage pattern of each of the plurality of users 128 creates a unique and aggregated consumption of the energy. The unique and aggregated consumption of the energy is based on a variation in number of the plurality of users 128. The variation in the number of the plurality of users 128 is based on days, months, seasons, events and time of year. In addition, the variation in the number of the plurality of users 128 may be based on architectural configurations of the built environment 102. In an example, the occupancy pattern of the plurality of users 128 in shopping malls increases during the festive seasons. In another example, the occupancy pattern at the soccer ground increases during the match day.

Further, the energy demand control system 122 accumulates the third set of statistical data associated with each of the plurality of energy storage and supply means 106 from the plurality of energy monitoring devices. The third set of statistical data includes a current and historical energy storage and supply capacity data associated with the plurality of energy storage and supply means 106. The plurality of energy monitoring devices record and collect energy storage and supply capacity data associated with the plurality of energy storage and supply means 106 to obtain the third set of statistical data. The energy demand control system 122 accumulates the third set of statistical data based on the second plurality of parameters (as mentioned above in detailed description of FIG. 1).

The energy demand control system 122 receives the fourth set of statistical data from the plurality of environmental sensors 118 associated with the built environment 102 (discussed above in detailed description of FIG. 1). In addition, the energy demand control system 122 receives the fourth set of statistical data from the plurality of external APIs 124 and the third party databases 206. The fourth set of statistical data includes the current and historical environmental condition data of at least one of inside and outside of the built environment 102. The fourth set of statistical data is received by the energy demand control system 122 based on a third plurality of parameters. In an embodiment of the present disclosure, the third plurality of parameters include but may not be limited to a means of recording environmental data having temperature, humidity and air pressure associated with each of the plurality of environmental sensors.

Further, the energy demand control system 122 gathers the fifth set of statistical data from the plurality of energy pricing models 120. The fifth set of statistical data includes current and historical recordings of energy pricing state affecting the built environment 102. The plurality of energy pricing models 120 record and transfer the energy pricing to the energy demand control system 122 in real time through the communication network 116. In addition, the energy demand control system 122 gathers the fifth set of statistical data from the plurality of external APIs 124 and the third party databases 206 (as discussed above in detailed description of FIG. 1). The fifth set of statistical data is gathered based on a fourth plurality of parameters. In an embodiment of the present disclosure, the fourth plurality of parameters include a means of recording energy pricing data having an energy pricing model, an energy price signal associated with the built environment 102.

Going further, the energy demand control system 122 performs the analysis of the first set of statistical data, the second set of statistical data, the third set of statistical data, the fourth set of statistical data and the fifth set of statistical data. The energy demand control system 122 performs the one or more statistical functions to generate the plurality of statistical results. The one or more statistical functions include translating the current operational state data and the past operational state data associated with the plurality of energy consuming devices 104 into energy demand values. In addition, the one or more statistical functions include parsing the first set of statistical data, the second set of statistical data and the third set of statistical data. The energy demand control system 122 develops an energy usage profile. The energy demand control system 122 develops the energy usage profile of each of the plurality of energy consuming devices 104, each of the plurality of energy storage and supply means 106 and each of the plurality of users 128. In addition, the energy demand control system 122 develops the energy usage profile associated with each zone of the floor, each group of zones of floor, each floor of a building and each of the one or more built environments.

Further, the one or more statistical functions include imputing one or more data entries in the first set of statistical data, the second set of statistical data and the third set of statistical data. The imputing of the one or more data entries is performed to minimize errors in deriving the energy consumption and demand associated with the built environment 102 for a given time interval. Moreover, the energy demand control system 122 imputes the one or more data entries by using an application of at least one of the statistical regression, interpolation and extrapolation.

The one or more statistical functions include comparing the current operational state data with the past operational state data. The energy demand control system 122 compares the current operational state data with the past operational state data associated with the each of the plurality of energy consuming devices 104. The current operational state data and the past operational state data are compared to determine the potential for improvement in energy consumption of each of the plurality of energy consuming devices 104. In addition, the energy demand control system 122 compares a current energy storage capacity and a past energy storage capacity associated with each of the plurality of energy storage and supply means 106. The current energy storage capacity and the past energy storage capacity are compared to determine the potential for improvement in charge/discharge cycles and energy storage capacity of each of the plurality of energy storage and supply means 106.

Accordingly, the analysis of the first set of statistical data, the second set of statistical data, the third set of statistical data, the fourth set of statistical data and the fifth set of statistical data provides the plurality of statistical results. The plurality of statistical results pertains to the energy consumption. In addition, the plurality of statistical results is based on a statistical data model. The statistical data model provides a complete insight into the energy consumption trend. The plurality of statistical results includes one or more graphs, one or more charts, one or more tables and one or more statistical maps of energy consumption. The plurality of statistical results are obtained as a function of duration of the operations of the plurality of energy consuming devices 104 and energy storage and supply capacity of the plurality of energy storage and supply means. In addition, the plurality of statistical results are obtained as a function of environmental conditions, and energy pricing affecting the built environment 102.

In an example, the plurality of statistical results include a table and chart of monthly energy consumption of the built environment 102 and a table of a total monthly variable energy load. In another example, the plurality of statistical results includes a pie chart to show a separation of the energy use in the built environment 102 and a table of energy consumption per month and air conditioner loads. In yet another example, the plurality of statistical results includes a statistical chart depicting a kWh consumption based on load type, a bar graph of expected air conditioner savings and service costs. In yet another example, the plurality of statistical results include a bar chart of gross rental, service and licensing costs of at least one of air conditioning units, air conditioning control means, statistical software and networks. In yet another example, the plurality of statistical results includes the statistical chart of total kWh consumed per room as a function of cold degree days.

Further, the energy demand control system 122 derives the set of prediction strategies. The set of prediction strategies are utilized for identifying the future time-variant energy demand and consumption associated with the built environment 102. The energy demand control system 122 derives the set of prediction strategies based on the plurality of statistical results. The set of prediction strategies are derived for driving controlled and directional execution of analysis of the set of predictions for optimum usage and operation of the plurality of energy consuming devices 104. In addition, the set of prediction strategies are derived for driving controlled and directional execution of the one or more control schemes for optimum usage and operation of the plurality of energy consuming devices 104.

The energy demand control system 122 derives a first prediction strategy of the set of prediction strategies. In an embodiment of the present disclosure, the first prediction strategy is derived by accounting time and event dependent occupancy of the plurality of users 128 associated with the built environment 102. In another embodiment of the present disclosure, the first prediction strategy is derived by accounting frequency of usage of each of the plurality of energy consuming devices 104 associated with the built environment 102. In yet another embodiment of the present disclosure, the first prediction strategy is derived accounting a deviation in load demand from standard demand values.

The energy demand control system 122 derives a second prediction strategy of the set of prediction strategies. In an embodiment of the present disclosure, the second prediction strategy is derived by accounting key features of architectural designs of the built environment 102. In another embodiment of the present disclosure, the second prediction strategy is derived by accounting luminance factors associated with the built environment 102. In yet another embodiment of the present disclosure, the second strategy is derived by accounting a number of loads per specific area of the built environment 102.

The energy demand control system 122 derives a third prediction strategy of the set of prediction strategies. In an embodiment of the present disclosure, the third prediction strategy is derived by accounting each user's associated usage of the plurality of energy consuming devices 104. In another embodiment of the present disclosure, the third strategy is derived by accounting pre-collected energy demand profiles. In yet another embodiment of the present disclosure, the third strategy is derived by accounting a plurality activities associated with each user of the plurality of users 128.

The energy demand control system 122 monitors a set of factors corresponding to the set of prediction strategies. The set of factors include time and event dependent occupancy factors and frequency of usage factors of each of the plurality of energy consuming devices 104. In addition, the set of factors include the key architectural design feature factors and environmental condition factors associated with the built environment 102. Moreover, the set of factors include the energy usage profile factors of a user and load per specific area factors associated with the built environment 102. The set of factors corresponding to the set of prediction strategies discretely indicates prominence of a type of prediction strategy over another type of prediction strategy of the set of prediction strategies.

The energy demand control system 122 performs switching to a prediction strategy from the set prediction strategies. The energy demand control system 122 performs switching based on selective prominence of one or more factors in the monitored set of factors corresponding to a type prediction strategy of the set of prediction strategies. In an example, the occupancy pattern of the plurality of users 128 in gymkhana X increases during the time interval of 5:00 pm to 10:00 pm. In addition, the occupancy pattern associated with the gymkhana X remains low. The energy demand control system 122 associated with the gymkhana X analyzes that the architectural designs and the average energy consumption of each user associated with the gym remains unaltered. In addition, the energy demand control system 122 takes into account the time dependent occupancy pattern as a prominent factor for predicting the future potential energy demand and consumption associated with the gymkhana X. In addition, the energy demand control system 122 derives the first prediction strategy.

In another example, the key architectural design features of an assembly unit associated with an automobile manufacturing plant Y is different from the key architectural design features of a quality testing unit associated with the automobile manufacturing plant Y. The energy demand control system 122 monitors and analyzes that the key architectural design features associated with both the assembly unit and the quality testing unit are crucial in performing operations. In addition, the energy demand control system 122 takes into account the key architectural design features as a prominent factor for predicting the future potential energy demand and consumption. Moreover, the energy demand control system 122 associated with the automobile manufacturing plant Y derives different prediction strategies for the assembly unit and the quality testing unit of the automobile manufacturing plant Y.

In yet another example of a hospital Z, the energy usage profile of a person D admitted in an ICU ward is monitored by various types of health monitoring devices like medical imaging machines, CT scanners, dialysis machines and medical monitors. The energy demand control system 122 associated with the hospital Z monitors the real time energy demand and consumption. In addition, the energy demand control system 122 analyzes and identify that the energy usage profile of a person D is crucial in predicting the future potential energy demand and consumption associated with the ICU ward. The energy demand control system 122 takes into account the energy usage profile of the person D as a prominent factor for predicting the future potential energy demand and consumption associated with the ICU ward. In addition, the energy demand control system 122 performs switching to a type of prediction strategy accounting the person D's energy usage profile as a prominent factor for predicting the future potential demand and consumption.

Further, the energy demand control system 122 predicts the set of predictions for identifying the potential future time-variant energy demand and consumption associated with the built environment 102. The energy demand control system 122 predicts the set of predictions based on switching the prediction strategies relevant to the time-variant energy demand and consumptions associated with the built environment 102. The energy demand control system 122 predicts the set of predictions by performing one or more mathematical functions. In an example, the one or more mathematical functions include but may not be limited to auto-regressive integrated moving average (hereinafter as "ARIMA") models and artificial neural networks. In another example, the one or more mathematical functions include but may not be limited to Gaussian processes, historical averages, trend analysis and extrapolating functions.

The set of predictions include a correlation of the current energy demand and the past energy demand based on the operational state of each of the plurality of energy consuming devices 104 associated with the built environment 102. In addition, the set of predictions include the correlation of the current energy demand and the past energy demand based on the energy storage capacity of the plurality of energy storage and supply means 106. Moreover, the set of predictions include the correlation of the current energy demand and the past energy demand based on the environmental sensors recordings and energy pricing. Also, the set of predictions include a recognition of unusual and unexpected behaviors in the energy demand and consumption of each of the plurality of energy consuming devices 104 associated with the built environment 102. In addition, the set of predictions include the correlation of energy demand and energy storage pertaining to the one or more built environments.

Further, the energy demand control system 122 executes the one or more control schemes to optimize the time-variant energy demand and consumption of the built environment 102. The energy demand control system 122 executes the one or more control schemes based on the set of predictions identifying the potential future time-variant energy demand and consumption associated with the built environment 102. The one or more control schemes includes a potential operational and non-operational instructions for optimizing the operating state of the plurality of energy consuming devices 104. In addition, the one or more control schemes includes the potential operational and non-operational instructions for improving the energy storage capacity of the plurality of energy storage and supply means 106. The potential operational and non-operational instructions include regulating power supply of each of the plurality of energy consuming devices 104 based on an occupancy pattern, energy demand and architectural design of the built environment 102. In addition, the potential operational and non-operational instructions include regulating energy consumption duration of the plurality of energy consuming devices 104.

Further, the potential operational and non-operational instructions include notifying a list of malfunctioning devices of the plurality of energy consuming devices 104. Furthermore, the potential operational and non-operational instructions include performing an operation on the plurality of energy consuming devices 104. The operation is selected from a group of operations consisting of upgrading, downgrading, replacing and repairing of the plurality of energy consuming devices 104. Moreover, the operational and non-operational instructions include prompting the plurality of energy storage and supply means 106 to start and stop charge cycles at specific time periods for reducing energy consumption costs. In addition, the operational and non-operational instructions include prompting the plurality of energy storage and supply means 106 to start and stop discharge cycles for controlling the peak loading periods. Moreover, the operational and non-operational instructions include regulating the charging and discharging characteristics of each of the plurality of energy storage and supply means 106.

The energy demand control system 122 executes the one or more control schemes through the communication network 116. In an embodiment, the energy demand control system 122 executes the one or more control schemes through the network based automatic control system 202. The network based automatic control system 202 is associated with the built environment 102. In addition, the network based automatic control system 202 is associated with a plurality of electrical control relays. In addition, the network based automatic control system 202 is associated with a microprocessor based switches. The network based automatic control system 202 sends one or more control signals based on the one or more control schemes. The network based automatic control system 202 automatically applies the one or more control schemes to the built environment 102. The network based automatic control system 202 controls the operation of each of the plurality of energy consuming devices 104. In addition, the network based automatic control system 202 controls the plurality of energy consuming devices 104 based on the occupancy behavior of the plurality of users 128 and energy storage capacity of the plurality of energy storage and supply means 106. Moreover, the network based automatic control system 202 controls the plurality of energy consuming devices 104 based on weather conditions and real time energy pricing associated with the built environment 102. Furthermore, the network based automatic control system 202 controls the plurality of energy storage and supply means 106 based on the real time energy demand, weather conditions and forecasts, and real time energy pricing associated with the built environment 102.

Further, the energy demand control system 122 provides the improvement in the prediction of the potential future time-variant energy demand and consumption associated with the built environment 102. The improvement in the prediction is obtained from a learning algorithm. The learning algorithm enable the energy demand control system 122 to predict more accurate and precise future time-variant energy demand and consumption by deriving a specific prediction strategy. In addition, the accurate and precise prediction enables the energy demand control system 122 to execute the one or more control schemes to control and optimize the time variant energy demand and consumption in real time.

The learning algorithm accelerates assessment and the analysis of one or more data points. The one or more data points are associated with the energy consumption of each of the plurality of energy consuming devices 104 and each of the plurality of energy storage and supply means 106 installed the built environment 102. The energy demand control system 122 utilizes the one or more data points to create a continuous closed control and feedback loop for optimizing the operating state of the plurality of energy consuming devices 104. In addition, the energy demand control system 122 utilizes the one or more data points to create a continuous closed control and feedback loop for improving the energy storage capacity of the plurality of energy storage and supply means 106.

The energy demand control system 122 stores the first set of statistical data, the second set of statistical data, the third set of statistical data, the fourth set of statistical data and the fifth set of statistical data in the database 204a in real time. In addition, the energy demand control system 122 stores the plurality of statistical results and a first log file having the set of prediction strategies in the database 204a in real time. Moreover, the energy demand control system 122 stores a second log file having the set of predictions and a third log file having the one or more control schemes in a database 204a in real time.

The energy demand control system 122 updates the first set of statistical data, the second set of statistical data, the third set of statistical data, the fourth set of statistical data and the fifth set of statistical data. In addition, the energy demand control system 122 updates the plurality of statistical results and the first log file having the set of prediction strategies in real time. Moreover, the energy demand control system 122 updates the second log file having the set of predictions and the third log file having the one or more control schemes in real time.

The energy demand control system 122 displays the first set of statistical data, the second set of statistical data, the third set of statistical data, the fourth set of statistical data and the fifth set of statistical data on the one or more statistical monitoring devices 126. In addition, the energy demand control system 122 displays the plurality of statistical results and the first log file having the set of prediction strategies in real time. Moreover, the energy demand control system 122 stores the second log file having the set of predictions and the third log file having the one or more control schemes in real time.

FIG. 3 illustrates a block diagram 300 of the energy demand control system 122, in accordance with various embodiment of the present disclosure. It may be noted that to explain the system elements of FIG. 3, references will be made to the system elements of the FIG. 1 and the FIG. 2. The energy demand control system 122 includes a collection module 302, a fetching module 304, an accumulation module 306, a reception module 308, a gathering module 310 and an analyzing module 312. In addition, the energy demand control system 122 includes a deriving module 314, a monitoring module 316, a switching module 318, a prediction module 320 and an execution module 322. Moreover, the energy demand control system 122 includes a storage module 324, an updating module 326 and a displaying module 328. The above mentioned modules are configured for adaptively switching the prediction strategies to optimize the time-variant energy demand and consumption of the built environment 102.

The collection module 302 collects the first set of statistical data associated with each of the plurality of energy consuming devices 104 installed in the built environment 102. The first set of statistical data includes the current operational state data and the past operational state data associated with the plurality of energy consuming devices 104. The plurality of energy metering devices collects the first set of statistical data. The plurality of energy metering devices transfers the first set of statistical data to the one or more data collecting devices 110. The one or more data collecting devices 110 transfer the first set of statistical data to the energy demand control system 122 (as explained above in the detailed description of FIG. 1 and FIG. 2).

The fetching module 304 fetches the second set of statistical data associated with the occupancy behavior of the plurality of users 128 present inside the built environment 102. The second set of statistical data includes the energy consumption behavior of each of the plurality of users 128 present inside the built environment 102. In addition, the second set of statistical data includes the occupancy pattern of each of the plurality of users 128 present inside the built environment 102. The plurality of occupancy detection means and the plurality of sensors 108 fetches the second set of statistical data in real time. In addition, the plurality of occupancy detection means and the plurality of sensors 108 transfer the second set of statistical data to the energy demand control system 122 (as discussed above in detailed description of FIG. 1 and FIG. 2).

The accumulation module 306 accumulates the third set of statistical data associated with each of the plurality of energy storage and supply means 106 associated with the built environment 102. The third set of statistical data includes the current and historical energy storage and supply capacity data associated with the plurality of energy storage and supply means 106. The plurality of energy monitoring devices accumulates the energy storage and supply capacity data associated with each of the plurality of energy storage and supply means 106 in real time to obtain the third set of statistical data. In addition, the plurality of energy monitoring devices transfer the third set of statistical data to the energy demand control system 122 (as explained above in detailed description of FIG. 1 and FIG. 2).

The reception module 308 receives the fourth set of statistical data associated with each of the plurality of environmental sensors 118. The fourth set of statistical data includes the current and historical environmental condition data of at least one of inside and outside of the built environment 102. The plurality of environmental sensors 118 records the environmental condition data in real time to obtain the fourth set of statistical data. In addition, the plurality of environmental sensors 118 transfers the fourth set of statistical data to the energy demand control system 122. Moreover, the reception module 308 receives the fourth set of statistical data from the plurality of external APIs 124 and the third party databases 206 (as discussed above in detailed description of FIG. 1 and FIG. 2).

The gathering module 310 gathers the fifth set of statistical data associated with each of the plurality of energy pricing models 120. The fifth set of statistical data includes the current and historical recordings of the energy pricing state affecting the built environment 102. The plurality of energy pricing models 120 record the real time energy pricing state associated with the built environment 102 to obtain the fifth set of statistical data. In addition, the plurality of energy pricing models transfer the fifth set of statistical data to the energy demand control system 122. Moreover, the gathering module 310 gathers the fifth set of statistical data from the plurality of external APIs 124 and the third party databases 206 (as explained above in detailed description of FIG. 1 and FIG. 2).

The analyzing module 312 analyzes the first set of statistical data, the second set of statistical data, the third set of statistical data, the fourth set of statistical data and the fifth set of statistical data. The analyzing module 312 includes a translation module 312a, a parsing module 312b, an imputing module 312c and a comparison module 312d. The translation module 312a translates the current operational state data and the past operational state data associated with the plurality of energy consuming devices 104 into the energy demand values. In addition, the translation module 312a translates the current operational state data and the past operational state data into the energy demand values for the pre-defined interval of time (as discussed in detailed description of FIG. 1 and FIG. 2).

Further, the parsing module 312b parses the first set of statistical data, the second set of statistical data and the third set of statistical data. The parsing module 312b parses the first set of statistical data, the second set of statistical data and the third set of statistical data based on the physical location of each of the plurality of energy consuming devices 104. In addition, the parsing module 312b parses the first set of statistical data, the second set of statistical data and the third set of statistical data based on the occupancy pattern of the plurality of users 128. Moreover, the parsing module 213b parses the first set of statistical data, the second set of statistical data and the third set of statistical data based on the weather conditions and real time energy pricing state (as explained above in the detailed description of FIG. 1 and FIG. 2).

Further, the imputing module 312c imputes the one or more data entries in the first set of statistical data, the second set of statistical data and the third set of statistical data (as discussed above in detailed description of FIG. 1 and FIG. 2). Furthermore, the comparison module 312d compares the current operational state data with the past operational state data associated with the each of the plurality of energy consuming devices 104. In addition, the comparison module 312d compares the current energy storage capacity and the past energy storage capacity associated with each of the plurality of energy storage and supply means 106 (as discussed above in detailed description of FIG. 1 and FIG. 2).

The analysis is performed to generate the plurality of statistical results associated with the energy consumption of the built environment 102 in real time. The plurality of statistical results includes one or more graphs, one or more charts, one or more tables and one or more statistical maps of the energy consumption as a function of duration of the operations. Further, the plurality of statistical results includes base-load, variable load, the cost of the operations, energy efficiency, the temperature, humidity and daylight. Furthermore, the plurality of statistical results includes the real time occupancy of the plurality of users 128 inside the built environment 102 and physical parameters of each of the plurality of energy consuming devices 104.

The deriving module 314 derives the set of prediction strategies. The set of prediction strategies are utilized for identifying the future time-variant energy demand and consumption associated with the built environment 102. The energy demand control system 122 derives the set of prediction strategies based on the plurality of statistical results. The set of prediction strategies are derived for driving controlled and directional execution of analysis of the set of predictions for optimum usage and operation of the plurality of energy consuming devices 104. In addition, the set of prediction strategies are derived for driving controlled and directional execution of the one or more control schemes for optimum usage and operation of the plurality of energy consuming devices 104. Further, the deriving module 314 derives the first strategy, the second strategy and the third strategy (as explained in detailed description of FIG. 2).

The monitoring module 316 monitors the set of factors corresponding to the set of prediction strategies. The set of factors includes time and event dependent occupancy factors and frequency of usage factors of each of the plurality of energy consuming devices 104. In addition, the set of factors include the key architectural design feature factors and environmental condition factors associated with the built environment 102. Moreover, the set of factors include the energy usage profile factors of a user and load per specific area factors associated with the built environment 102. The set of factors corresponding to the set of prediction strategies discretely indicates prominence of a type of prediction strategy over another type of prediction strategy of the set of prediction strategies. Furthermore, the switching module 318 performs switching to the prediction strategy from the set prediction strategies. The switching module 318 performs switching based on the selective prominence of the one or more factors in the monitored set of factors (as discussed in detailed description of FIG. 2).

The prediction module 320 predicts the set of predictions for identifying the potential future time-variant energy demand and consumption associated with the built environment 102. The prediction module 320 predicts the set of predictions based on switching the prediction strategies relevant to the time-variant energy demand and consumptions associated with the built environment 102. The prediction module 320 predicts the set of predictions by performing the one or more mathematical functions (as mentioned in detailed description of FIG. 2).

Further, the execution module 322 executes the one or more control schemes to optimize the time-variant energy demand and consumption of the built environment 102. The execution module 322 executes the one or more control schemes based on the set of predictions identifying the potential future time-variant energy demand and consumption associated with the built environment 102. The one or more control schemes includes the potential operational and non-operational instructions for optimizing the operating state of the plurality of energy consuming devices 104.

The storage module 324 stores the first set of statistical data, the second set of statistical data, the third set of statistical data, the fourth set of statistical data and the fifth set of statistical data in the database 204a in real time. In addition, the storage module 324 stores the plurality of statistical results and the first log file having the set of prediction strategies in the database 204a in real time. Moreover, the storage module 324 stores the second log file having the set of predictions and the third log file having the one or more control schemes in a database 204a in real time.

The updating module 326 updates the first set of statistical data, the second set of statistical data, the third set of statistical data, the fourth set of statistical data and the fifth set of statistical data. In addition, the updating module 326 updates the plurality of statistical results and the first log file having the set of prediction strategies in real time. Moreover, the updating module 326 updates the second log file having the set of predictions and the third log file having the one or more control schemes in real time.

The displaying module 328 displays the first set of statistical data, the second set of statistical data, the third set of statistical data, the fourth set of statistical data and the fifth set of statistical data on the one or more statistical monitoring devices 126. In addition, the displaying module 328 displays the plurality of statistical results and the first log file having the set of prediction strategies in real time. Moreover, the displaying module 328 stores the second log file having the set of predictions and the third log file having the one or more control schemes in real time.

FIG. 4 illustrates a flow chart 400 for adaptively switching the prediction strategies to optimize the time-variant energy demand and consumption of the built environment 102, in accordance with various embodiments of the present disclosure. It may be noted that to explain the process steps of flowchart 400, references will be made to the system elements of FIG. 1, FIG. 2 and FIG. 3. It may also be noted that the flowchart 400 may have lesser or more number of steps.

The flowchart 400 initiates at step 402. Following step 402, at step 404, the analyzing module 312 analyzes the first set of statistical data, the second set of statistical data, the third set of statistical data, the fourth set of statistical data and the fifth set of statistical data by performing the one or more statistical functions. Further at step 406, the deriving module 314 derives the set of prediction strategies. The set of prediction strategies for driving controlled and directional execution of the analysis and evaluation of the set of predictions for optimum usage and operation of the plurality of energy consuming devices 104. At step 408, the monitoring module 316 monitors the set of factors corresponding to the set of prediction strategies. Further at step 410, the switching module 318 performs switching to a prediction strategy from the set of derived prediction strategies. The switching is performed based on the selective prominence of the one or more factors in the monitored set of factors. At step 412, the prediction module 320 predicts the set of predictions. The prediction is performed for identifying the potential future time-variant energy demand and consumption associated with the built environment 102. Further at step 414, the execution module 322 executes the one or more control schemes. The one or more control schemes are executed based on the set of predictions identifying the potential future time-variant energy demand and consumption associated with the built environment 102. The flow chart 400 terminates at step 416.

FIG. 5 illustrates a block diagram of a computing device 500, in accordance with various embodiments of the present disclosure. The computing device 500 includes a bus 502 that directly or indirectly couples the following devices: memory 504, one or more processors 506, one or more presentation components 508, one or more input/output (I/O) ports 510, one or more input/output components 512, and an illustrative power supply 514. The bus 502 represents what may be one or more busses (such as an address bus, data bus, or combination thereof). Although the various blocks of FIG. 5 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. The inventors recognize that such is the nature of the art, and reiterate that the diagram of FIG. 5 is merely illustrative of an exemplary computing device 500 that can be used in connection with one or more embodiments of the present invention. Distinction is not made between such categories as "workstation," "server," "laptop," "hand-held device," etc., as all are contemplated within the scope of FIG. 5 and reference to "computing device." The computing device 500 typically includes a variety of computer-readable media. The computer-readable media can be any available media that can be accessed by the computing device 500 and includes both volatile and nonvolatile media, removable and non-removable media. By way of example, and not limitation, the computer-readable media may comprise computer storage media and communication media. The computer storage media includes volatile and nonvolatile, removable and non-removable media implemented in any method or technology for storage of information such as computer-readable instructions, data structures, program modules or other data. The computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by the computing device 500. The communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 504 includes computer-storage media in the form of volatile and/or nonvolatile memory. The memory 504 may be removable, non-removable, or a combination thereof. Exemplary hardware devices include solid-state memory, hard drives, optical-disc drives, etc. The computing device 500 includes one or more processors that read data from various entities such as memory 504 or I/O components 512. The one or more presentation components 508 present data indications to a user or other device. Exemplary presentation components include a display device, speaker, printing component, vibrating component, etc. The one or more I/O ports 510 allow the computing device 500 to be logically coupled to other devices including the one or more I/O components 512, some of which may be built in. Illustrative components include a microphone, joystick, game pad, satellite dish, scanner, printer, wireless device, etc.

The present disclosure has many advantages over the existing art. The present disclosure provides technical advantages, economic advantages as well as ancillary benefits. The present disclosure enables the utilization of the energy storage and supply means having relatively smaller size and energy storage capacity for addressing the same time-variant load reduction requirements. In addition, the present disclosure controls a large amount of energy loads or demands and cost associated with the installation and operations. Moreover, the present disclosure provides a stable grid network resulting in stable energy pricing and removing volatility of current power system designs.

The foregoing descriptions of specific embodiments of the present technology have been presented for purposes of illustration and description. They are not intended to be exhaustive or to limit the present technology to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is understood that various omissions and substitutions of equivalents are contemplated as circumstance may suggest or render expedient, but such are intended to cover the application or implementation without departing from the spirit or scope of the claims of the present technology.

While several possible embodiments of the invention have been described above and illustrated in some cases, it should be interpreted and understood as to have been presented only by way of illustration and example, but not by limitation. Thus, the breadth and scope of a preferred embodiment should not be limited by any of the above-described exemplary embodiments.

What is claimed is:

1. A computer-implemented method for adaptively switching prediction strategies to optimize time-variant energy demand and consumption of one or more built environments, the computer-implemented method comprising analyzing, at an energy demand control system with a processor, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models including current and historical recordings of energy pricing state affecting power purchases at the one or more built environments, the analyzing being done by performing one or more statistical functions to generate a plurality of statistical results;

deriving, at the energy demand control system with the processor, a set of prediction strategies based on the plurality of statistical results, the set of prediction strategies driving controlled and directional execution of analysis and evaluation of a set of predictions for optimum usage and operation of the plurality of energy consuming devices;

monitoring, at the energy demand control system with the processor, a set of factors corresponding to the set of prediction strategies discretely indicating prominence of a type of prediction strategy over an another type of prediction strategy of the set of prediction strategies, wherein the monitoring being performed in real time;

switching, at the energy demand control system with the processor, to a prediction strategy from the set of derived prediction strategies, wherein the switching being performed based on selective prominence of one or more factors in the monitored set of factors corresponding to switched predication strategy of the one or more prediction strategies and wherein the switching being performed in real time;

predicting, at the energy demand control system with the processor, a set of predictions for identifying a potential future time-variant energy demand and consumption associated with the one or more built environments, wherein the prediction being performed in real time; and executing, at the energy demand control system with the processor, one or more control schemes for controlling the time-variant energy demand and consumption of the one or more built environments associated with the renewable energy sources, the one or more control schemes being executed based on the set of predictions identifying the potential future time-variant energy demand and consumption associated with the one or more built environments.

2. The computer-implemented method of claim 1, wherein the set of prediction strategies comprises:

a first prediction strategy of accounting time and event dependent occupancy, frequency of usage of each of the plurality of energy consuming devices and deviation in load demand from standard demand values;

a second prediction strategy of accounting key features of architectural design of the one or more built environments, luminance factors and number of loads per specific area of the one or more built environments; and
a third prediction strategy of accounting each user's associated usage of the plurality of energy consuming devices, pre-collected energy demand profiles and a plurality of activities of each user of the plurality of users.

3. The computer-implemented method of claim 1, wherein the set of predictions comprises a correlation of a current energy demand and a past energy demand based on the operational state of the plurality of energy consuming devices, energy storage capacity of the plurality of energy storage and supply means, environmental sensors recordings and energy pricing, a recognition of unusual and unexpected behaviors in the energy demand and consumption of each of the plurality of energy consuming devices, correlation of energy demand and energy storage pertaining to the one or more built environments.

4. The computer-implemented method of claim 1, further comprising collecting, at the energy demand control system with the processor, the first set of statistical data associated with the plurality of energy consuming devices present in the one or more built environments, wherein the first set of statistical data comprises a current operational state associated with the energy consuming devices and a past operational state data associated with the energy consuming devices, wherein the first set of statistical data being collected based on a first plurality of parameters, wherein the first plurality of parameters comprises a set of operational characteristics associated with each of the plurality of energy consuming devices and a set of physical characteristics associated with each of the plurality of energy consuming devices, wherein the set of operational characteristics comprises a current rating, a voltage rating, a power rating, a frequency of operation, an operating temperature, a device temperature, the duration of operation, a seasonal variation in operation and off-seasonal variation in operation and wherein the set of physical characteristics comprises a device size, a device area, a device physical location and a portability of device and wherein the first set of statistical data being collected in real time.

5. The computer-implemented method of claim 1, further comprising fetching, at the energy demand control system with the processor, the second set of statistical data associated with the occupancy behavior of the plurality of users present inside each of the one or more built environments, wherein the second set of statistical data comprises a first plurality of occupancy data and a second plurality of occupancy data, wherein the first plurality of occupancy data being associated with energy consumption behavior of each of one or more occupants present inside the one or more built environments and the second plurality of occupancy data being associated with an occupancy pattern of each of the one or more occupants present inside the one or more built environments.

6. The computer-implemented method of claim 1, further comprising accumulating, at the energy demand control system with the processor, the third set of statistical data associated with each of the plurality of energy storage and supply means, wherein the third set of statistical data comprises a current and historical energy storage and supply capacity data associated with the plurality of energy storage and supply means, wherein the accumulation of the third set of statistical data being performed based on a third plurality of parameters, wherein the third plurality of parameters comprises charging and discharging rates, temperature characteristics, an energy storage and release capacity, charge current, charge level, discharge current, idle time and depth of discharge associated with the plurality of energy storage and supply means and wherein the third set of statistical data being accumulated in real time.

7. The computer-implemented method of claim 1, further comprising receiving, at the energy demand control system with the processor, the fourth set of statistical data associated with each of the plurality of environmental sensors pertaining to the one or more built environments, wherein the fourth set of statistical data comprises a current and historical environmental condition data associated with the one or more built environments, wherein the reception of the fourth set of statistical data being performed based on a fourth plurality of parameters, wherein the fourth plurality of parameters comprises a means of recording environmental data comprising temperature, humidity and air pressure associated with each of the plurality of environmental sensors associated with the one or more built environments and wherein the environmental data being obtained from a plurality of external application programming interfaces and a plurality of third party databases and wherein the fourth set of statistical data being received in real time.

8. The computer-implemented method of claim 1, further comprising gathering, at the energy demand control system with the processor, the fifth set of statistical data associated with each of the plurality of energy pricing models, the gathering of the fifth set of statistical data being done based on a fifth plurality of parameters, wherein the fifth plurality of parameters comprises a means of recording energy pricing data including an energy pricing model or an energy price signal associated with the one or more built environments and wherein the energy pricing data is obtained from a plurality of external application programming interfaces and a plurality of third party databases and wherein the fifth set of statistical data is gathered in real time.

9. The computer-implemented method of claim 1, wherein the one or more control schemes comprises potential operational and non-operational instructions and wherein the potential operational and non-operational instructions comprises:
regulating power supply of each of the plurality of energy consuming devices based on an occupancy pattern, energy demand and architectural design of the one or more built environments;
regulating energy consumption duration of the plurality of energy consuming devices;
performing an operation on the plurality of energy consuming devices, the operation being selected from a group of operations consisting of upgrading, downgrading, replacing and repairing of the plurality of energy consuming devices;
prompting the plurality of energy storage and supply means to start and stop charge cycles at specific time periods for reducing energy consumption costs;
prompting the plurality of energy storage and supply means to start and stop discharge cycles for controlling peak loading periods; and
regulating charging and discharging characteristics of each of the plurality of energy storage and supply means.

10. The computer-implemented method of claim 1, wherein the one or more statistical functions comprises:
translating current operational state data and past operational state data associated with the plurality of energy consuming devices into energy demand values for a pre-defined interval of time;

parsing the first set of statistical data, the second set of statistical data and the third set of statistical data;

imputing one or more data entries in the first set of statistical data, the second set of statistical data and the third set of statistical data based on a self-learning algorithm; and comparing the current operational state data with the past operational state data to determine potential for improvement in energy consumption of each of the plurality of energy consuming devices and a current energy storage capacity and a past energy storage capacity associated with each of the plurality of energy storage and supply means.

11. The computer-implemented method of claim 1, wherein the plurality of statistical results comprises one or more graphs, one or more charts, one or more tables and one or more statistical maps of energy consumption as a function of duration of the operations of the plurality of energy consuming devices, energy storage and supply capacity of the plurality of energy storage and supply means, environmental conditions and energy pricing affecting the one or more built environments.

12. The computer-implemented method of claim 1, further comprising storing, at the energy demand control system with the processor, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes in a database, wherein the storing being done in real time.

13. The computer-implemented method of claim 1, further comprising updating, at the energy demand control system with the processor, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes, wherein the updating being done in real time.

14. The computer-implemented method of claim 1, further comprising displaying, at the energy demand control system with the processor, the first set of statistical data, the second set of statistical data, the third set of statistical data, the fourth set of statistical data, the fifth set of statistical data, the plurality of statistical result, a first log file having the set of prediction strategies, a second log file having the set of predictions and a third log file having the one or more control schemes, wherein the displaying being provided on one or more statistical monitoring devices in real time.

15. A computer system comprising
one or more processors; and
a memory coupled to the one or more processors, the memory for storing instructions which, when executed by the one or more processors, cause the one or more processors to perform a method for adaptively switching prediction strategies to optimize time-variant energy demand and consumption of one or more built environments associated with renewable energy sources, the method comprising:
analyzing, at an energy demand control system, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models including current and historical recordings of energy pricing state affecting power purchase at the one ft more built environments, the analyzing being performed for determining optimized operating states of the plurality of energy consuming devices, the analyzing being done by performing one or more statistical functions to generate a plurality of statistical results;
deriving, at the energy demand control system, a set of prediction strategies based on the plurality of statistical results, the set of prediction strategies driving controlled and directional execution of analysis and evaluation of a set of predictions for optimum usage and operation of the plurality of energy consuming devices;
monitoring, at the energy demand control system, a set of factors corresponding to the set of prediction strategies discretely indicating prominence of the set of prediction strategies;
switching, at the energy demand control system, to a prediction strategy from the set of derived prediction strategies, wherein the switching being performed based on selective prominence of one or more factors in the monitored set of factors corresponding switched predication strategy of one or more prediction strategies;
predicting, at the energy demand control system, the set of predictions for identifying a potential future time-variant energy demand and consumption associated with the one or more built environments; and
executing, at the energy demand control system, one or more control schemes for controlling the time-variant energy demand and consumption of the one or more built environments associated with the renewable energy sources, the one or more control schemes being executed based on the set of predictions identifying the potential future time-variant energy demand and consumption associated with the one or more built environments.

16. The computer system of claim 15, further comprising storing, at the energy demand control system, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes in a database, wherein the storing being done in real time.

17. The computer system of claim 15, further comprising updating, at the energy demand control system, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes, wherein the updating being done in real time.

18. A non-transitory computer-readable storage medium encoding computer executable instructions that, when executed by at least one processor, performs a method for adaptively switching prediction strategies to optimize time-variant energy demand and consumption of one or more built environments, the method comprising:
analyzing, at a computing device, a first set of statistical data associated with a plurality of energy consuming devices, a second set of statistical data associated with an occupancy behavior of a plurality of users, a third set of statistical data associated with a plurality of energy storage and supply means, a fourth set of statistical data associated with a plurality of environmental sensors and a fifth set of statistical data associated with a plurality of energy pricing models including current and historical recordings of energy pricing state affecting power purchase at the one or more built environments, the analyzing being performed for determining optimized operating states of the plurality of energy consuming devices, the analyzing being done by performing one or more statistical functions to generate a plurality of statistical results;

deriving, at the computing device, a set of prediction strategies based or the plurality of statistical results, the set of prediction strategies driving controlled and directional execution of analysis and evaluation of a set of predictions for optimum usage and operation of the plurality of energy consuming devices;

monitoring, at the computing device, a set of factors corresponding to the set of prediction strategies discretely indicating prominence of the set of prediction strategies;

switching, at the computing device, to a prediction strategy from the set of derived prediction strategies, wherein the switching being performed based on selective prominence of one or more factors in the monitored set of factors corresponding switched predication strategy of one or more prediction strategies;

predicting, at the computing device, the set of predictions for identifying a potential future time-variant energy demand and consumption associated with the one or more built environments; and executing, at the computing device, one or more control schemes for controlling the time-variant energy demand and consumption of the one or more built environments associated with the renewable energy sources, wherein the one or more control schemes being executed based on the set of predictions identifying the potential future time-variant energy demand and consumption associated with the one or more built environments.

19. The non-transitory computer-readable storage medium of claim 18, further comprising storing, at the computing device, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes in a database, wherein the storing being done in real time.

20. The non-transitory computer-readable storage medium of claim 18, further comprising updating, at the computing device, the first set of statistical data, the second set of statistical data, the third set of statistical data, the fourth set of statistical data, the fifth set of statistical data, the plurality of statistical results, a first log file having the set of prediction strategies, a second log file having the set of predictions and a third log file having the one or more control schemes, wherein the updating being done in real time.

* * * * *